United States Patent
Nakano et al.

(10) Patent No.: US 8,433,013 B2
(45) Date of Patent: Apr. 30, 2013

(54) RECEIVER AND ELECTRONIC DEVICE USING THE SAME

(75) Inventors: Yusuke Nakano, Osaka (JP); Hiroaki Ozeki, Osaka (JP); Yasunobu Tsukio, Osaka (JP); Takeshi Fujii, Osaka (JP)

(73) Assignee: Panasonic Corporation, Osaka (JP)

( * ) Notice: Subject to any disclaimer, the term of this patent is extended or adjusted under 35 U.S.C. 154(b) by 303 days.

(21) Appl. No.: 12/933,163

(22) PCT Filed: Apr. 8, 2009

(86) PCT No.: PCT/JP2009/001630
§ 371 (c)(1),
(2), (4) Date: Sep. 17, 2010

(87) PCT Pub. No.: WO2009/128222
PCT Pub. Date: Oct. 22, 2009

(65) Prior Publication Data
US 2011/0019783 A1 Jan. 27, 2011

(30) Foreign Application Priority Data

Apr. 17, 2008 (JP) ................. 2008-107655
Apr. 17, 2008 (JP) ................. 2008-107657

(51) Int. Cl.
*H04L 27/06* (2006.01)
(52) U.S. Cl.
USPC ............ 375/344; 375/345; 455/266; 455/313
(58) Field of Classification Search ................... 375/344; 455/403
See application file for complete search history.

(56) References Cited

U.S. PATENT DOCUMENTS

| 6,823,181 B1 * | 11/2004 | Kohno et al. ................ 455/324 |
| 2005/0064843 A1 | 3/2005 | Oiwa et al. |
| 2005/0147192 A1 * | 7/2005 | Yamamoto et al. ........... 375/345 |

FOREIGN PATENT DOCUMENTS

| JP | 02-215216 A | 8/1990 |
| JP | 2004-274453 A | 9/2004 |
| JP | 2004-357025 A | 12/2004 |
| JP | 2005-094553 A | 4/2005 |

OTHER PUBLICATIONS

International Search Report for Application No. PCT/JP2009/001630, Jun. 9, 2009, Panasonic Corporation.

* cited by examiner

*Primary Examiner* — Leon-Viet Nguyen
(74) *Attorney, Agent, or Firm* — RatnerPrestia

(57) ABSTRACT

A receiver includes an oscillator for generating a local oscillator signal, a frequency converter for heterodyning a received signal of one frequency band or a plurality of frequency bands into an intermediate frequency (IF) signals with using the local oscillator signal, a filter connected to an output of the frequency converter and having a cut-off frequency changeable, an analog-digital (AD) converter connected to an output of the filter to convert an analog signal of one frequency band or a plurality of frequency bands into a digital signal, a pre-stage detector connected to an output of the AD converter or connected between the filter and the AD converter to detect a signal level, and a controller for controlling the cut-off frequency of the filter based on the signal level detected by the pre-stage detector.

17 Claims, 15 Drawing Sheets

RECEIVER AND ELECTRONIC DEVICE USING THE SAME

This Application is a U.S. National Phase Application of PCT International Application PCT/JP2009/001630.

TECHNICAL FIELD

The present invention relates to a receiver for receiving signals, and an electronic device using the receiver.

BACKGROUND ART

FIG. 17 is a block diagram of conventional receiver 101 disclosed in Patent Literature 1. As shown in FIG. 17, receiver 101 includes oscillators 102A and 102B, frequency converter 103, filter 104 connected to an output of frequency converter 103, AD converter 105, band-pass filters 110 and 111 connected to an output of AD converter 105, and demodulators 120 connected to respective outputs of band-pass filters 110 and 111. Oscillators 102A and 102B generate local oscillator signals. Frequency converter 103 heterodynes received signals of one or more channels into intermediate frequency (IF) signals with using the local oscillator signals generated by oscillators 102A and 102B. AD converter 105 converts analog signals received from filter 104 into digital signals.

Conventional receiver 101 can receive signals of plural channels simultaneously due to a single frequency converter 103 perform the heterodyning using plural oscillators 102A and 102B.

Conventional receiver 101, however, concurrently uses plural oscillators 102A and 102B in order to concurrently receive plural signals, thus requiring a large circuit size and a large electric power consumption.
Patent Literature 1: JP2004-357025A

SUMMARY OF THE INVENTION

A receiver includes an oscillator for generating a local oscillator signal, a frequency converter for heterodyning a received signal of one frequency band or a plurality of frequency bands into an intermediate frequency (IF) signals with using the local oscillator signal, a filter connected to an output of the frequency converter and having a cut-off frequency changeable, an analog-digital (AD) converter connected to an output of the filter to convert an analog signal of one frequency band or a plurality of frequency bands into a digital signal, a pre-stage detector connected to an output of the AD converter or connected between the filter and the AD converter to detect a signal level, and a controller for controlling the cut-off frequency of the filter based on the signal level detected by the pre-stage detector.

Even when the receiver receives plural frequency bands and the total level of the received signals is larger than a dynamic range of the AD converter, the signal level supplied to the AD converter can not be more than the dynamic range of the AD converter.

A receiver includes an oscillator for generating a local oscillator signal, a frequency converter for heterodyning a received signal of one frequency band or a plurality of frequency bands into an intermediate frequency (IF) signal with using the local oscillator signal, a filter connected to an output of the frequency converter and having a cut-off frequency changeable, an analog-digital (AD) converter connected to an output of the filter to convert an analog signal of one frequency band or a plurality of frequency bands into a digital signal, a pre-stage detector connected to an output of the AD converter of connected between the filter and the AD converter to detect a signal level, a controller for controlling the cut-off frequency of the filter based on the signal level detected by the pre-stage detector, a first band-pass filter connected to the output of the AD converter, a first demodulator connected to an output of the first band-pass filter, a second band-pass filter connected to the output of the AD converter and having a different passing frequency band from the first band-pass filter, and a second demodulator connected to an output of the second band-pass filter.

This receiver can demodulate plural received frequency bands simultaneously, thereby reducing the time for channel selection.

This receiver can also receive signals of plural frequency bands simultaneously by a single oscillator, thereby requiring a small circuit size.

REFERENCE NUMERALS

1 Receiver
2 Oscillator
3 Frequency Converter
4 Filter
5 AD Converter
6 Pre-Stage Detector
7 Controller
8 Variable Gain Amplifier
13 Receiver
14 Receiver
40 Band-Pass Filter
50 Attenuator

DETAILED DESCRIPTION OF PREFERRED EMBODIMENTS

Exemplary Embodiment 1

Figure 1:
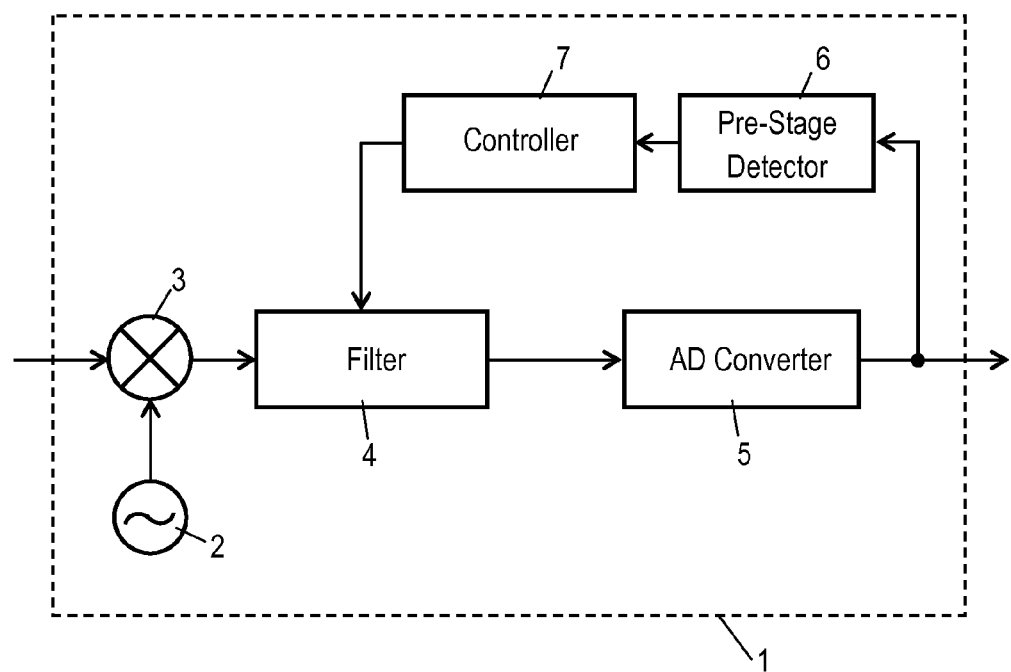
FIG. 1 is a block diagram of a receiver according to Exemplary Embodiment 1 of the present invention.

FIG. 1 is a block diagram of receiver 1 according to Exemplary Embodiment 1 of the present invention. Receiver 1 receives, e.g. terrestrial digital television (TV) broadcasting, and includes oscillator 2, frequency converter 3, filter 4, analog-digital (AD) converter 5, pre-stage detector 6, and controller 7, as shown in FIG. 1. Oscillator 2 generates a local oscillator signal. Frequency converter 3 heterodynes received signals of one or more frequency bands into intermediate frequency (IF) signals, with using the local oscillator signal generated by oscillator 2. Filter 4 is connected to an output of frequency converter 3, and has a cut-off frequency changed. AD converter 5 is connected to an output of filter 4, and converts analog signals of one or more frequency bands into digital signals. Pre-stage detector 6 is connected to an output of AD converter 5, and detects the signal level of the digital signals. Controller 7 controls the cut-off frequency of filter 4 based on the signal level detected by pre-stage detector 6. An input port of AD converter 5 is connected to the output of filter 4. In the following description, receiver 1 receives a terrestrial digital TV broadcasting signal as a received signal.

Frequency bands referred to in the following description are terrestrial digital TV broadcasting channels.

In terrestrial digital TV broadcasting, each channel of a frequency band can be divided into frequency bands referred to as segments, but the segments are received in the same manner as channels according to Exemplary Embodiments. Therefore, the present invention can be applied to receivers receiving the segments.

It has been attempted to use, as a digital TV broadcasting system, the following intermittent receiving methods: a time slicing (TS) in which a program is transmitted/received by being divided in time, or a time-frequency slicing (TFS) in which a program is transmitted/received by being divided in time and frequency. In the TFS, a specific program is transmitted by being divided into frequency bands. The present embodiment can be applied to receivers receiving broadcasting signals of the TFS.

Figure 2:
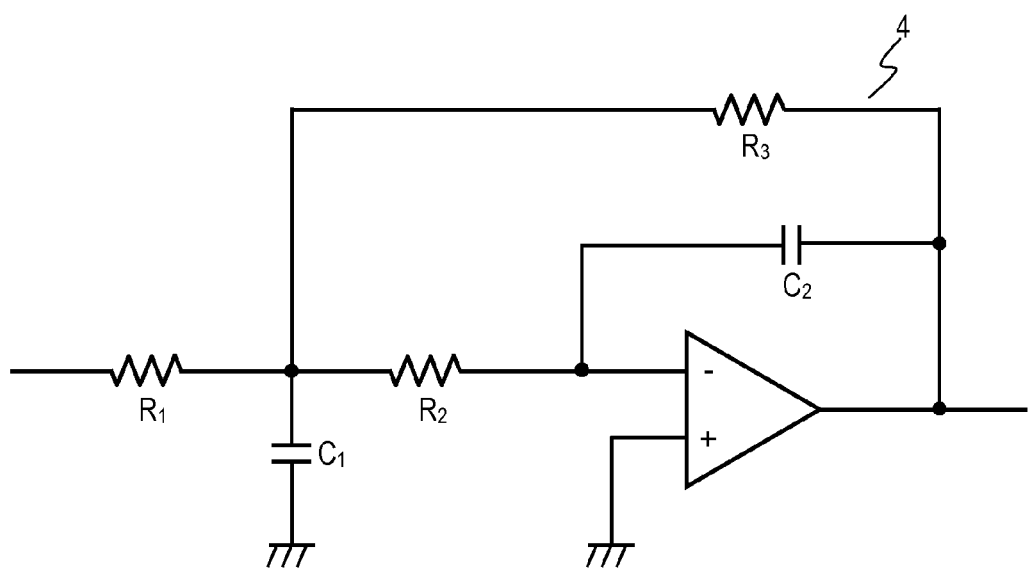
FIG. 2 is a circuit diagram of a filter of the receiver according to Embodiment 1.

FIG. 2 is a circuit diagram of filter 4 which is an elliptic function filter including active elements. Cut-off frequency fc of filter 4 is expressed by Formula 1.

$$fc = 1/(2 \cdot \pi) \cdot \{1/(R3 \cdot R2 \cdot C1 \cdot C2)\}^{1/2} \quad (1)$$

The cut-off frequency fc of filter 4 can be controlled by changing constants R2, R3, C1, and C2 shown in FIG. 2. For example, in order to change capacitances C1 and C2 of the capacitors shown in FIG. 2, a voltage-controlled variable capacitance capacitor is used, or capacitors having different capacitances are selected with a switch.

In receiver 1, controller 7 stores data indicating a detection result of pre-stage detector 6 or a predetermined reference value, and compares the data with a signal level output from pre-stage detector 6.

Figure 3:
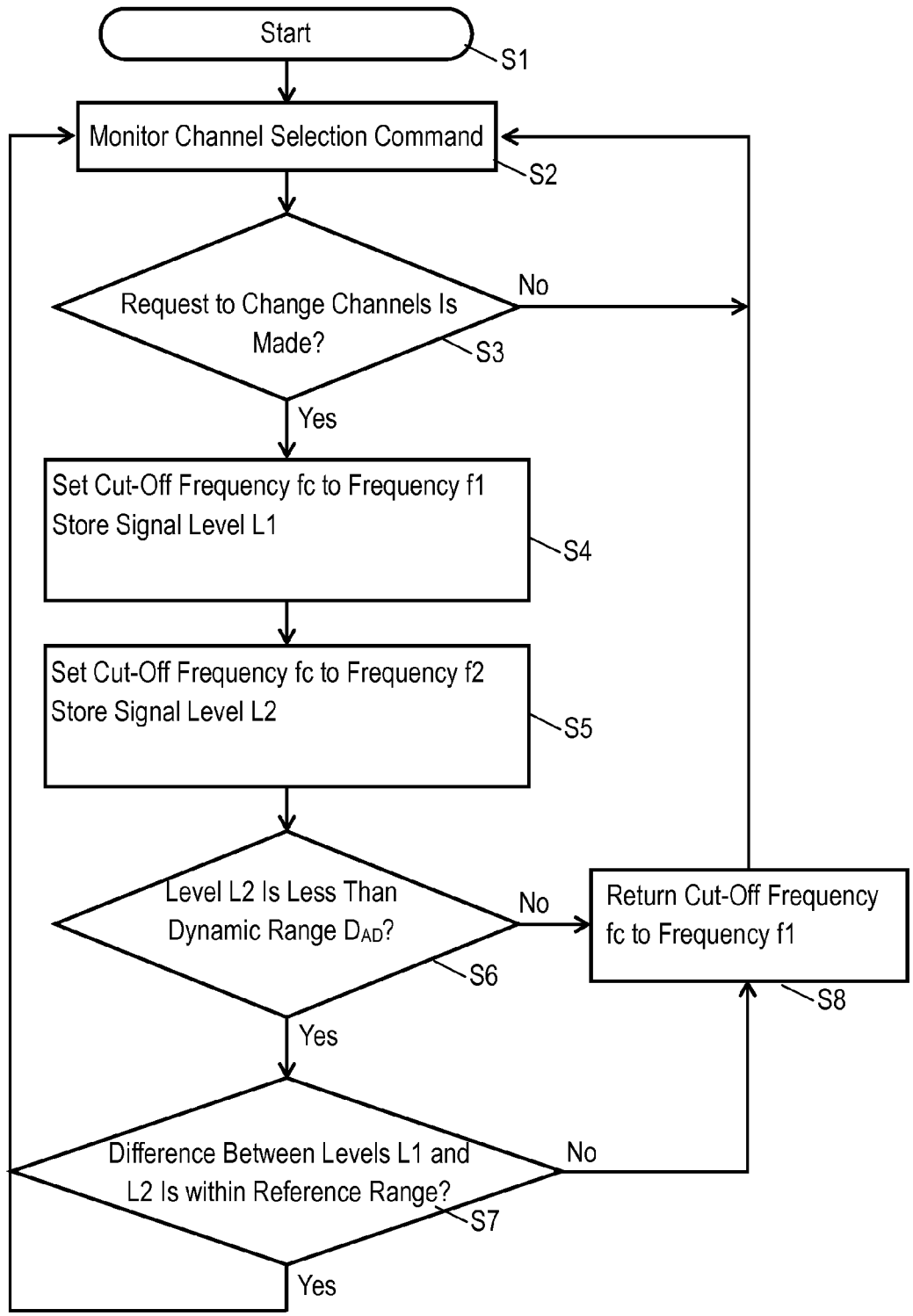
FIG. 3 shows processes of control of the receiver according to Embodiment 1.
Figure 4:
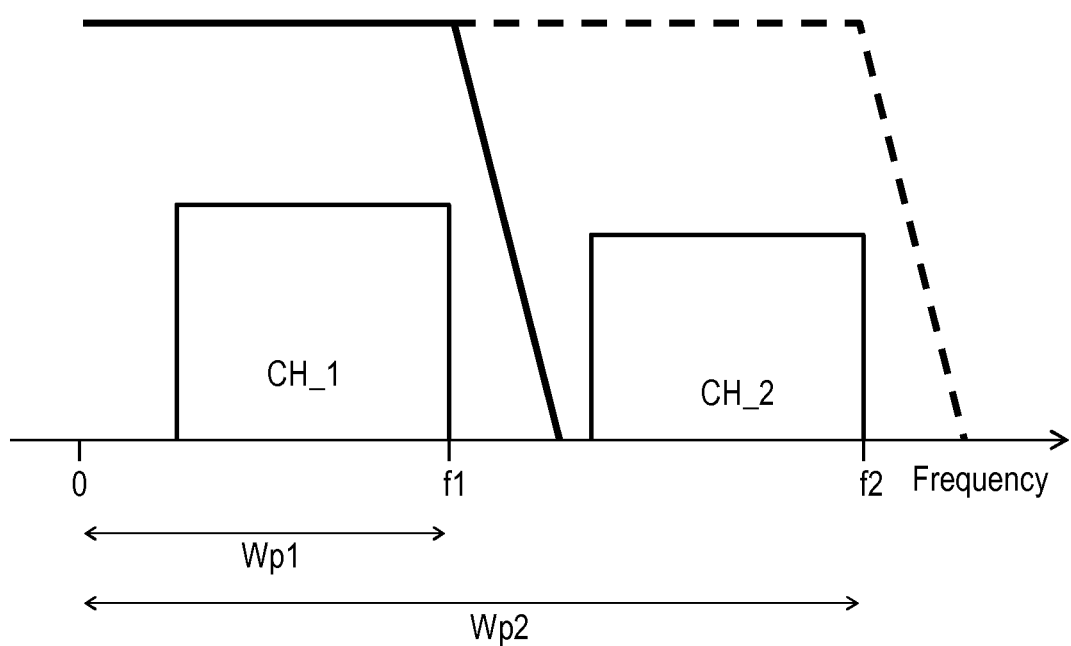
FIG. 4 shows a passband of the filter and a frequency allocation of received signals of the receiver according to Embodiment 1.

FIG. 3 is a flowchart of control of receiver 1 receiving plural channels simultaneously. FIG. 4 shows a passband of filter 4 and a frequency allocation of received signals. As shown in FIG. 4, first reception channel CH_1 and second reception channel CH_2 in an intermediate frequency (IF) band are adjacent to each other. The cut-off frequency of filter 4 can be changed to extend a pass-band width Wp. In FIG. 3, receiver 1 starts receiving terrestrial digital TV broadcasting (Step S1). Controller 7 of receiver 1 monitors a channel selection command from a user (Step S2), and determines whether or not a request to change channels is made by the user (Step S3). If no request is made at Step S3, the process returns to Step S2 at which controller 7 monitors the channel selection command from the user. Upon determining that the request to change channels is made by the user at Step S3, on the other hand, the controller heterodynes the received signal from a radio frequency (RF) band to an IF band using oscillator 2 and frequency converter 3 (Step S4). Controller 7 then sets a cut-off frequency f1 of filter 4 so as to pass only the signal of the channel CH_1 when this channel is desired by the user (Step S4). Then, pre-stage detector 6 detects a signal level L1 of the channel CH_1. The signal level L1 is converted to a digital value by AD converter 5, and controller 7 stores the level L1 (Step S4). Then, controller 7 changes the cut-off frequency fc of filter 4 to a cut-off frequency f2 so as to extend the pass-band width Wp from a width Wp1 to a width Wp2, allowing the channel CH_2 to pass through filter 4. Pre-stage detector 6 then detects a signal level L2 which is the total level of the signals of the channels CH_1 and CH_2. Controller 7 stores the signal level L2 (Step S5). Controller 7 determines whether or not the signal level L2 is more than a dynamic range $D_{AD}$ of AD converter 5 (Step S6). If controller 7 determines that the signal level L2 exceeds the dynamic range $D_{AD}$ of AD converter 5 at Step S6, controller 7 determines that the two signals cannot be received simultaneously. Then, controller 7 returns the cut-off frequency fc from the frequency f2 to the frequency f1 so as to receive only the signal of channel CH_1 and not to receive the signal of the channel CH_2. Controller 7 then monitors the channel selection command from the user at Step S2. If two signals are different largely in their levels, it is difficult to receive the two signals simultaneously. Therefore, upon determining at Step S6 that the signal level L2 is not more than the dynamic range $D_{AD}$ of AD converter 5, controller 7 determines whether or not the difference between the levels L1 and L2 is within a reference range (Step S7). In the case that the signals of the two channels CH_1 and CH_2 are received as shown in FIG. 4, if the two signals have levels identical to each other, the signal level L2 is twice as much electric power as receiving one channel, and hence, the total received power increases by 3 dB. Therefore, the reference range in Step S7 can be set to, for example, a range from 2 dB to 4 dB. When the difference between the signal levels L1 and L2 is within this reference range, controller 7 determines that the two signals can be received simultaneously, and maintains the cut-off frequency fc at the frequency f2. Then, controller 7 monitors the channel selection command from the user at Step S2. When the difference between the levels L1 and L2 is larger than the reference range, on the other hand, controller 7 returns the cut-off frequency fc to frequency f1 (Step S8), and monitors the channel selection command from the user at Step S2.

In the above-described control, even when receiver 1 receives plural channels to having signal level larger than the dynamic range $D_{AD}$ of AD converter 5 input thereto, controller 7 controls the cut-off frequency fc of filter 4 so as to make the signal level supplied to AD converter 5 not more than the dynamic range $D_{AD}$ of AD converter 5. In other words, controller 7 allows receiver 1 to receive the signals of plural channels simultaneously with using a single oscillator 2, hence reducing a circuit size of receiver 1.

Pre-stage detector 6 detects the output level of AD converter 5 as a digital value, holds the detected level, and easily compares the level to previous data or predetermined data. Pre-stage detector 6 can also change the precision of the cut-off frequency of filter 4. The detection and control of the digital values can be implemented by a digital circuit, reducing the size of receiver 1.

Figure 5:
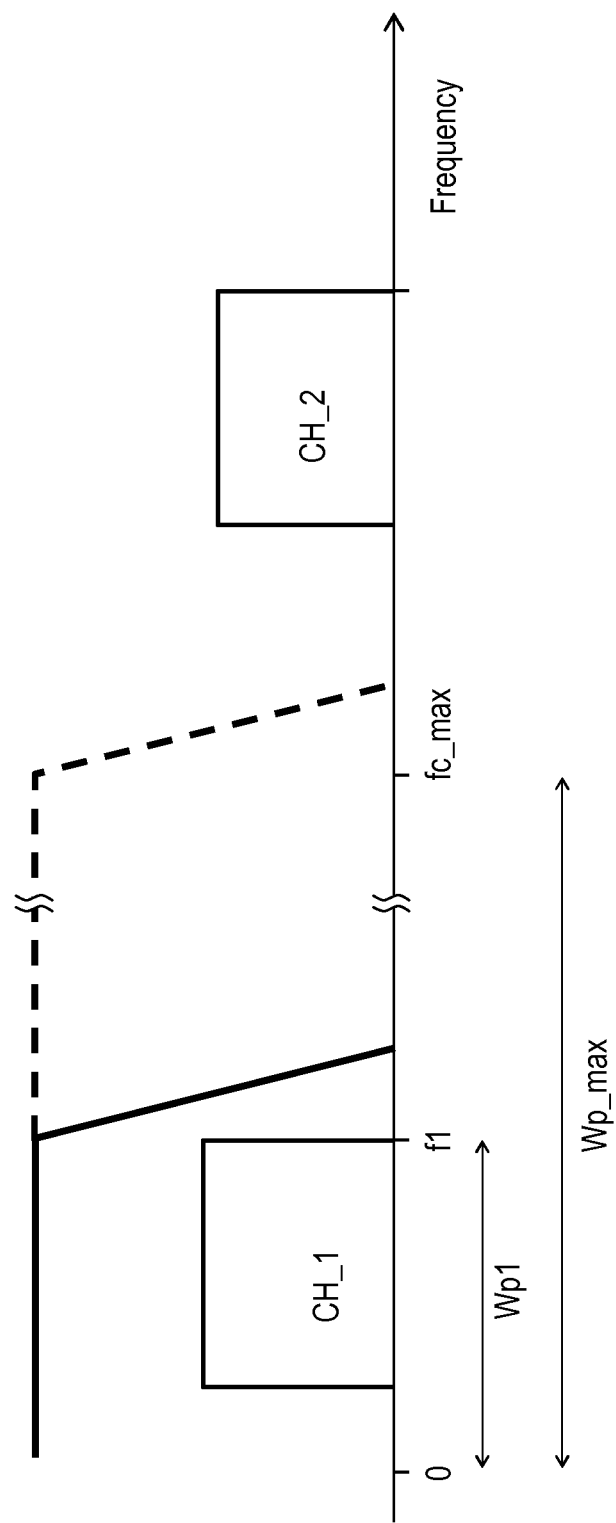
FIG. 5 shows a passband of the filter and the frequency allocation of received signals of the receiver according to Embodiment 1.

The channels shown in FIG. 4 are adjacent to each other, but receiver 1 can also receive channels located away from each other. Receiver 1 receives two channels simultaneously, and can also receive one channel, or three or more channels simultaneously. FIG. 5 shows the pass-band width Wp of filter 4 and a frequency allocation of signals received by receiver 1. As shown in FIG. 5, receiver 1 cannot concurrently receive signals of plural channels when a least one of the channels has frequencies higher than a maximum cut-off frequency fc_max which is the upper limit of the cut-off frequency fc. In other words, receiver 1 cannot concurrently receive the signals of two channels when at least one of the channels has frequencies outside a maximum pass-band width Wp_max, which is the limit of the extension of the pass-band width Wp of filter 4. In these cases, controller 7 does not change the cut-off frequency fc of filter 4 to extend the band. In the case that a frequency band is allocated to each broadcasting station in each region of a country, such as terrestrial digital TV broadcasting or conventional analog TV broadcasting in Japan, controller 7 of receiver 1 stores, for example, a channel table. Controller 7 refers to the stored channel table, and determines whether or not a space between the frequencies of two desired channels exceeds the maximum pass-band width Wp_max. When the space exceeds the width Wp_max, controller 7 does not extend the pass-band width Wp by changing the cut-off frequency of filter 4. When the space between the frequencies of two channels is within the maximum pass-band width Wp_max, on the other hand, controller 7 changes the cut-off frequency fc of filter 4 so as to extend the pass-band width Wp. Thus, controller 7 can control receiver 1 to receive signals efficiently with low electric power consumption.

Figure 6:
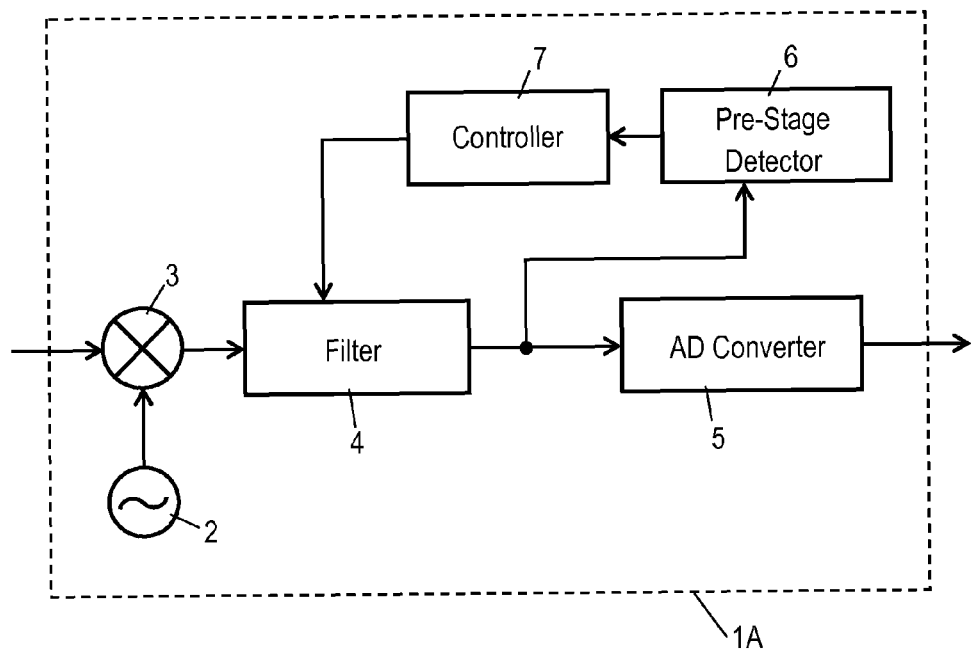
FIG. 6 is a block diagram of another receiver according to Embodiment 1.

FIG. 6 is a block diagram of another receiver 1A according to Embodiment 1. In FIG. 6, components identical to those of receiver 1 shown in FIG. 1 are denoted by the same reference numerals, and their description will be omitted. In receiver 1A shown in FIG. 6, pre-stage detector 6 is connected between filter 4 and AD converter 5 so as to detect the output level of filter 4. This allows AD converter 5 to receive a signal level not more than its dynamic range almost all the time, thereby preventing signals of AD converter 5 from distorting, hence providing receiver 1A with high receiving quality.

Figure 7:
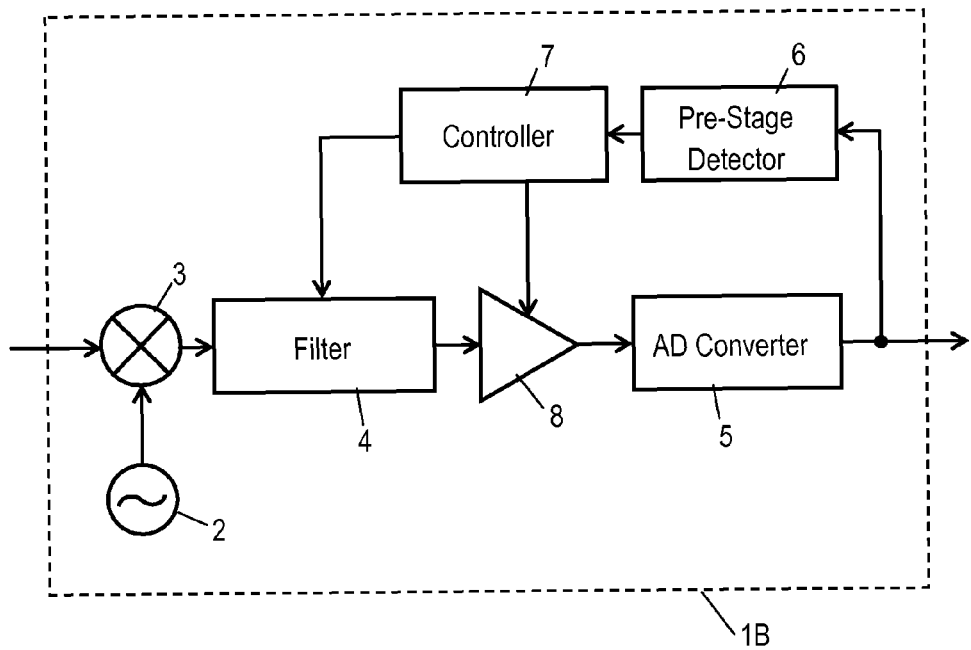
FIG. 7 is a block diagram of still another receiver according to Embodiment 1.

FIG. 7 is a block diagram of still another receiver 1B according to Embodiment 1. In FIG. 7, components identical to those of receiver 1 shown in FIG. 1 are denoted by the same reference numerals, and their description will be omitted. In receiver 1B of FIG. 7, Variable gain amplifier 8 for amplifying a received signal is connected between filter 4 and AD converter 5. Controller 7 also controls the gain of variable gain amplifier 8 based on the signal level detected by pre-stage detector 6. Controller 7 preferably controls the cut-off frequency fc of filter 4 and the gain of variable gain amplifier 8 so as to meet the following conditions. First, the signal level supplied to AD converter 5 is not more than the dynamic range $D_{AD}$ of AD converter 5. Second, the signal has an electric power which minimizes a quantization error, while maintaining the ratio of peak to average power (PAPR) and the margin for power fluctuation due to fading or other problems. As a result, AD converter 5 can receive a substantially constant signal level any time regardless of the cut-off frequency fc of filter 4. Furthermore, the output signal level of filter 4 can be reduced by the amount corresponding to the gain of variable gain amplifier 8, thereby preventing the signal of filter 4 from distorting and providing receiver 1B with high receiving quality.

Figure 8:
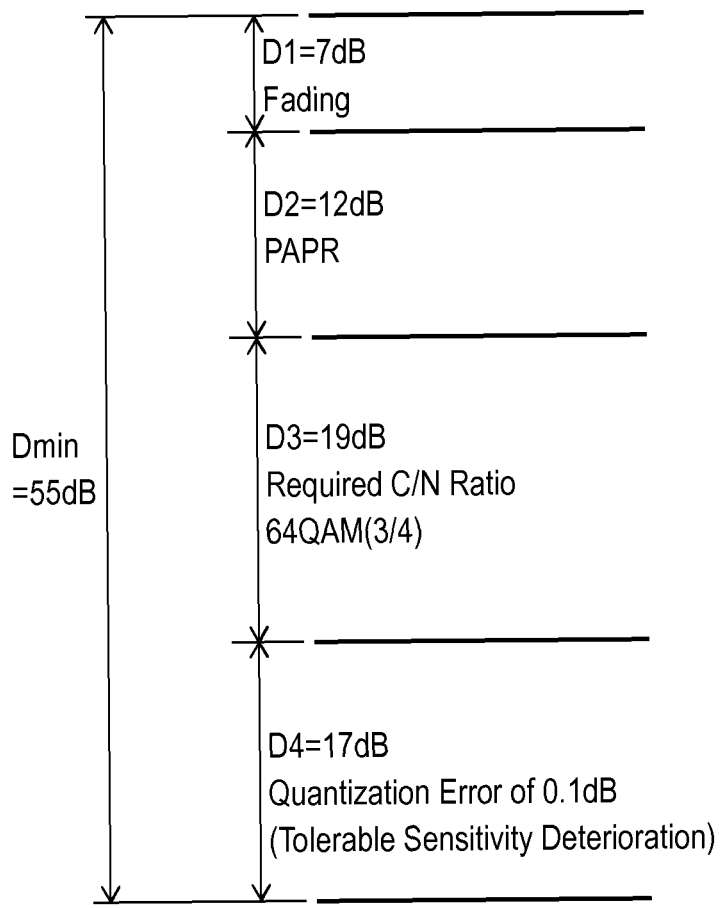
FIG. 8 shows a breakdown of a dynamic range of an AD converter of the receiver according to Embodiment 1.

In receivers for terrestrial digital TV broadcasting, an AD converter used as AD converter 5 often has a 10 bit resolution. One-bit resolution can express an about 6 dB amplitude of a received signal. For example, AD converter 5 having a 10-bit resolution has a dynamic range $D_{AD}$ of 60 dB ($=10^6$). FIG. 8 shows a breakdown of a minimum necessary dynamic range Dmin of AD converter 5. The dynamic range Dmin is the sum of dynamic ranges D1 to D4. As shown in FIG. 8, the range D1 is for a fading margin for a mobile environment, and is 7 dB according to Embodiment 1. The range D2 is the PAPR of an orthogonal frequency division multiplexing (OFDM) signal, and is 12 dB according to embodiment 1. The range D3 is for the carrier-to-noise ratio (C/N) required to demodulate modulated signals, and is 19 dB according to Embodiment 1. The range D4 is for a tolerable quantization error range not more than 0.1 dB due to the signal AD-converted by AD converter 5, and is 17 dB according to Embodiment 1. Thus, the minimum necessary dynamic range Dmin is 55 dB. Therefore, AD converter 5 having dynamic range $D_{AD}$ of 60 dB provides an amplitude margin of 5 dB (=60−55). According to Embodiment 1, when the receiver receives the channel CH_2 having the same level as the channel CH_1, the total signal level increases only by 3 dB. Therefore, when the dynamic range $D_{AD}$ of AD converter 5 has excess amplitude of 5 dB, the receiver can receive signals of at least two channels simultaneously. When in an environment not susceptible to the occurrence of fading, such as in a fixed environment, the receiver according to Embodiment 1 does not need the above-described fading margin, and therefore, can receive signals of three or more channels simultaneously. The receiver according to Embodiment 1 can even receive signals of ten or more channels simultaneously, upon including AD converter 5 having a 100 dB or more dynamic range, such as a ΔΣ-type AD converter.

In the case that pre-stage detector 6 is connected to the output of AD converter 5, pre-stage detector 6 can detect the output level of AD converter 5 as a digital value, holds it, and easily compares it to previous data or predetermined data. Further, pre-stage detector 6 can also easily control the cut-off frequency fc of filter 4 accurately. The detection and control of digital values can be implemented by a digital circuit, hence reducing the size of the receiver.

Figure 9A:
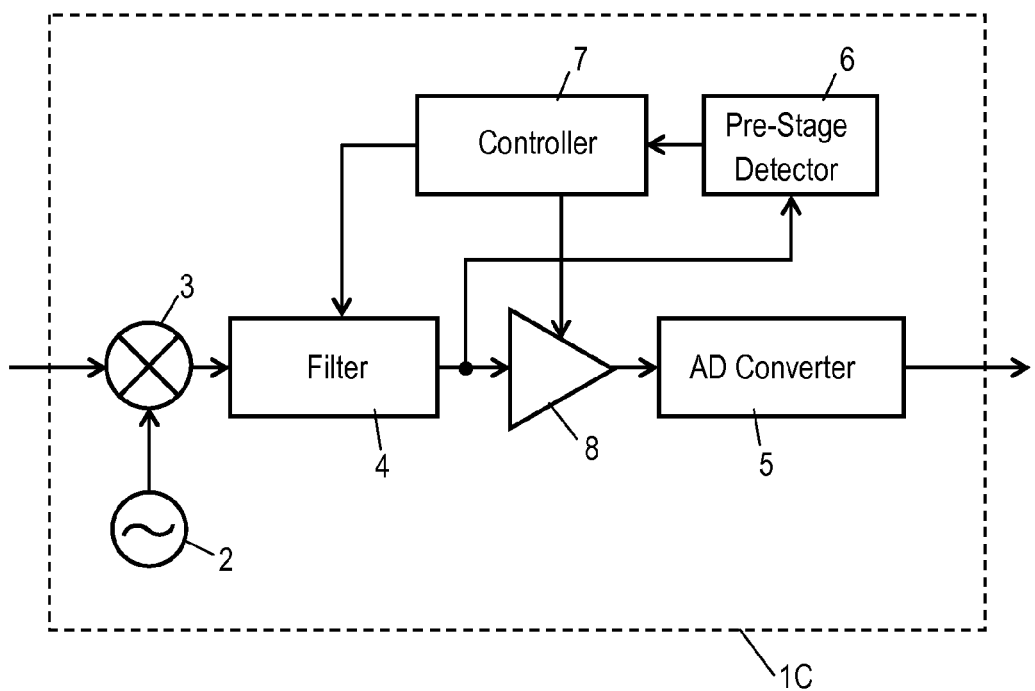
FIG. 9A is a block diagram of a further receiver according to Embodiment 1.

FIG. 9A is a block diagram of further receiver 1C according to Embodiment 1. In FIG. 9A, components identical to those of receiver 1B shown in FIG. 7 are denoted by the same reference numerals, and their description will be omitted. In receiver 1C shown in FIG. 9A, pre-stage detector 6 is connected between filter 4 and variable gain amplifier 8 so as to detect the output level of filter 4. This receiver sets, for example, an appropriate threshold to control filter 4 so as to prevent variable gain amplifier 8 from saturating. Even when strong interference signals exist outside the desired band, receiver 1C can block them, thereby preventing variable gain amplifier 8 from saturating.

Figure 9B:
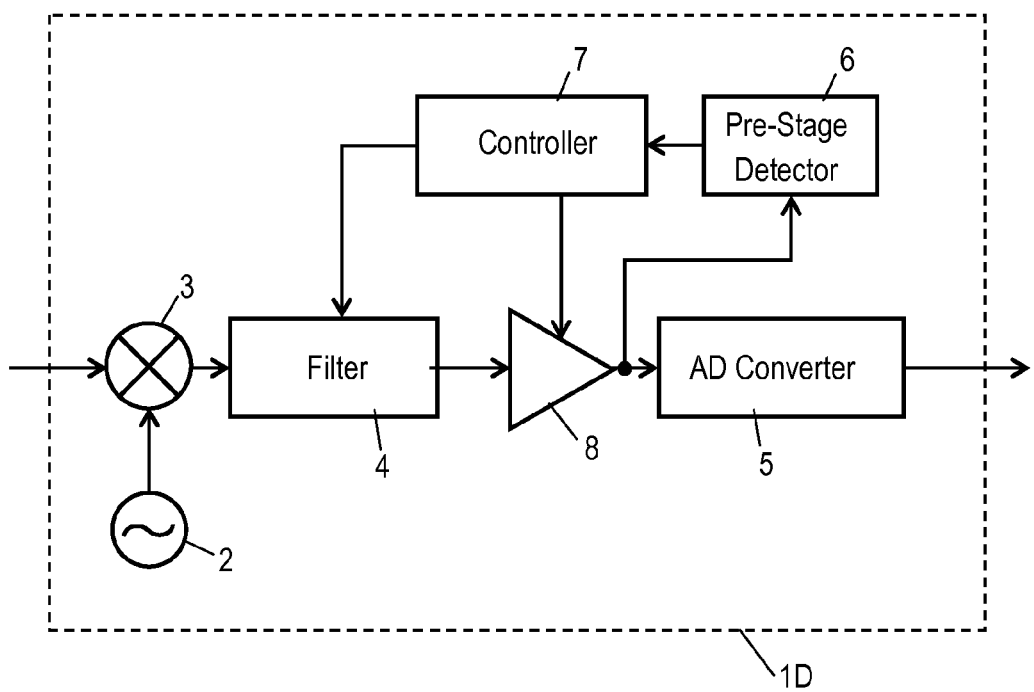
FIG. 9B is a block diagram of a further receiver according to Embodiment 1.

FIG. 9B is a block diagram of further receiver 1D according to Embodiment 1. In FIG. 9B, components identical to those of receiver 1B shown in FIG. 7 are denoted by the same reference numerals, and their description will be omitted. In receiver 1D shown in FIG. 9B, pre-stage detector 6 is connected between variable gain amplifier 8 and AD converter 5 so as to detect the output level of variable gain amplifier 8. This receiver prevents AD converter 5 from saturating in the initial stage of channel selection, providing receiver 1D with high receiving quality.

Figure 10A:
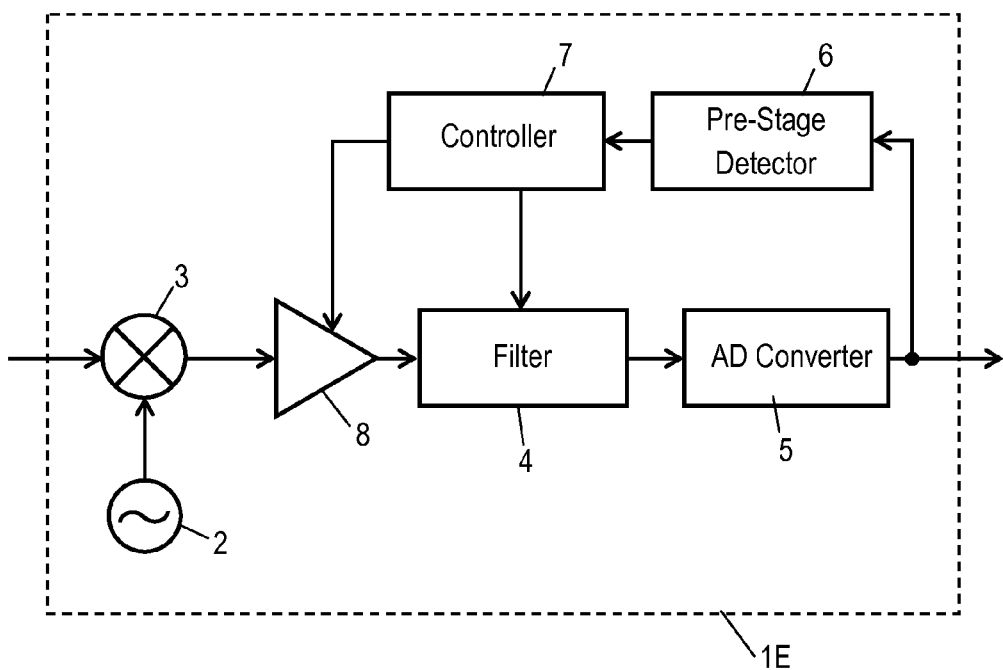
FIG. 10A is a block diagram of a further receiver according to Embodiment 1.

FIG. 10A is a block diagram of further receiver 1E according to Embodiment 1. In FIG. 10A, components identical to those of receiver 1B shown in FIG. 7 are denoted by the same reference numerals, and their description will be omitted. In receiver 1E shown in FIG. 10A, variable gain amplifier 8 is connected between frequency converter 3 and filter 4 so as to amplify the output of frequency converter 3. This receiver can reduce noise can to a white noise level so as to increase the C/N ratio of received signals depending on the performance of filter 4. As a result, receiver 1E has high receiving quality.

Figure 10B:
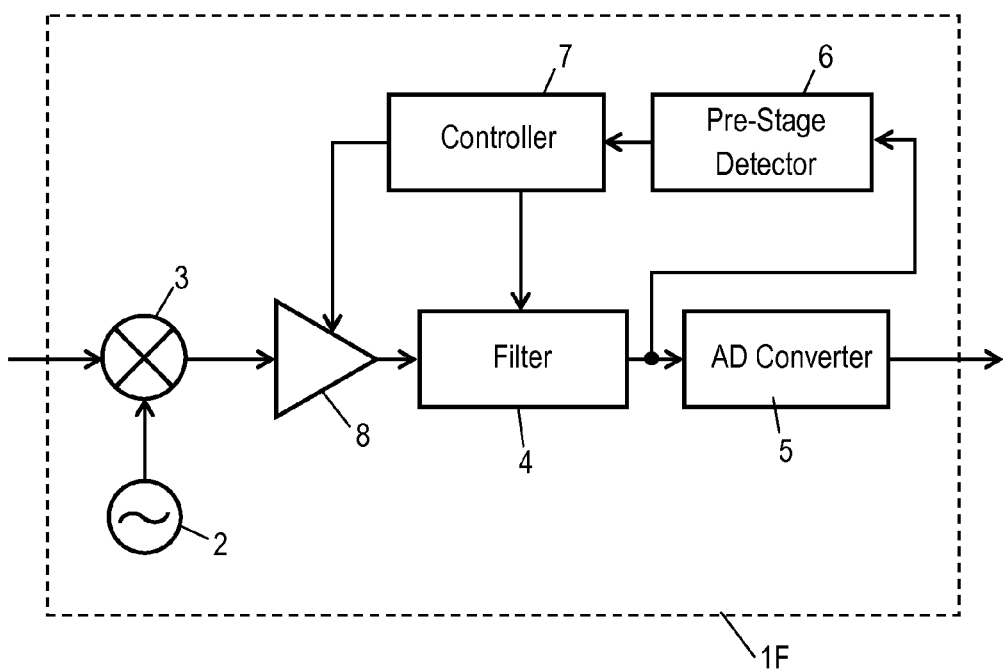
FIG. 10B is a block diagram of a further receiver according to Embodiment 1.

FIG. 10B is a block diagram of further receiver 1F according to Embodiment 1. In FIG. 10B, components identical to those of receiver 1E shown in FIG. 10A are denoted by the same reference numerals, and their description will be omitted. In receiver 1F, pre-stage detector 6 is connected between filter 4 and AD converter 5. This receiver prevents AD converter 5 from saturating in the initial stage of channel selection, and reduces noise to a white noise level so as to increase the C/N ratio of received signal depending on the performance of filter 4. As a result, receiver 1F has high receiving quality.

A control of controller 7 when filter 4 has frequency characteristics in its passing frequency band or in the band amplified by variable gain amplifier 8 will be described. In general, filter 4 has a frequency characteristic in the passband. Controller 7 preferably stores the frequency characteristic of filter 4 previously, and controls the gain of variable gain amplifier 8 so as to make the input level of AD converter 5 substantially constant with respect to the frequency characteristic of filter 4. In this case, the receiver can have high receiving quality for a larger number of reception channels.

Figure 11:
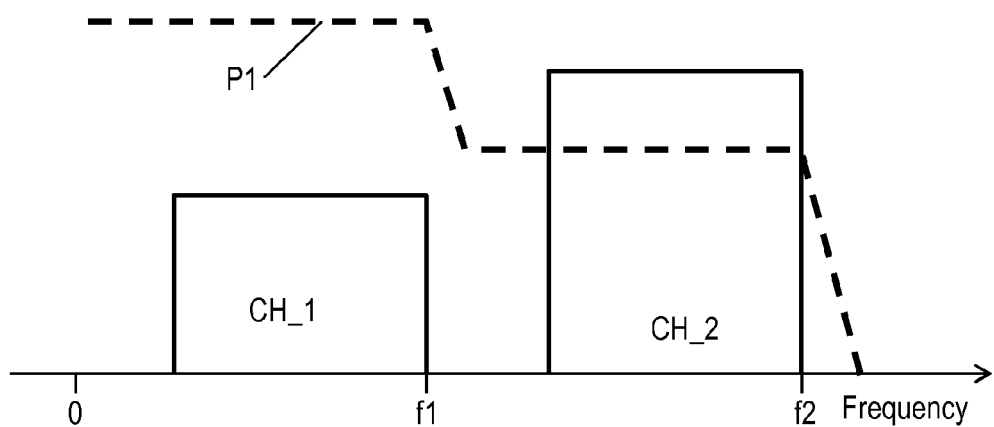
FIG. 11 shows a passband of another filter and a frequency allocation of received signals of the receiver according to Embodiment 1.
Figure 12A:
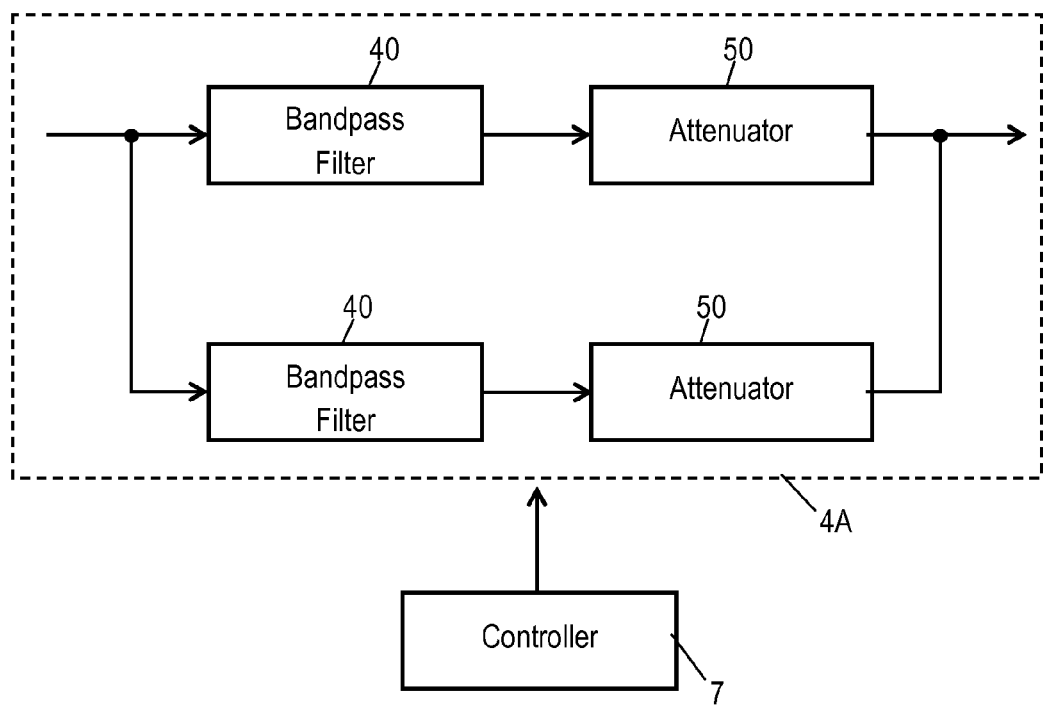
FIG. 12A is a block diagram of the filter of the receiver according to Embodiment 1 shown in FIG. 11.

FIG. 11 shows pass characteristic P1 of filter 4A used in place of filter 4 and a frequency allocation of received signals according to Embodiment 1. FIG. 12A is a block diagram of filter 4A. The signal of the channel CH_1 has a lower signal level than the signal of the channel CH_2. In FIG. 11, receiver 1 (1B-1F) is placed in a receiving environment in which the received channels have different signal levels. Filter 4A includes one or more band-pass filters 40 and one or more attenuators 50, and has pass characteristic P1 shown in FIG. 11. Controller 7 controls the attenuation amount of attenuators 50 shown in FIG. 12A to cause filter 4A to have pass characteristic P1 shown in FIG. 11. Controller 7 particularly controls the amount of insertion loss of pass characteristic P1 so that the channels received by AD converter 5 all have the same signal level, thereby providing receiver 1 (1B to 1F) with high receiving quality.

Figure 12B:
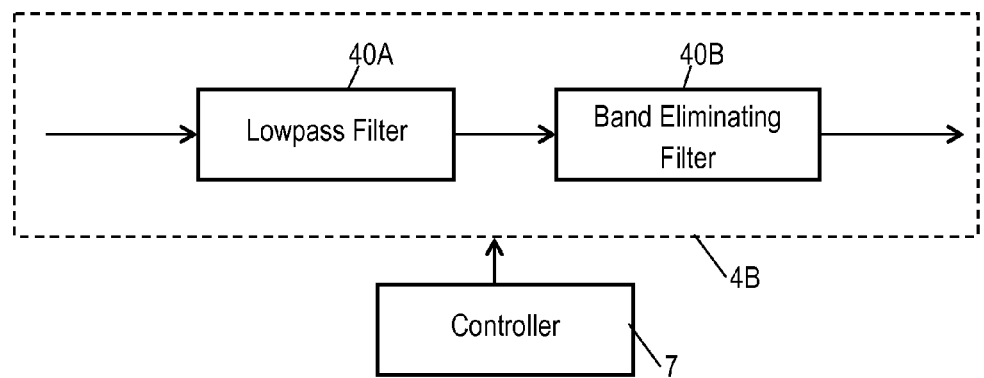
FIG. 12B is a block diagram of still another filter of the receiver according to Embodiment 1.

FIG. 12B is a block diagram of filter 4B used in place of filter 4 according to Embodiment 1. Filter 4B includes low-pass filter 40A and band-eliminating filter 40B. Band-eliminating filter 40B is a notch filter attenuating a band width. Controller 7 adaptively controls the pass-band width of low-pass filter 40A and the attenuating band width of the notch filter. Low-pass filter 40A passes both the signals of the channels CH_1 and CH_2. The notch filter attenuates the signal of the channel CH_1 having the larger signal level, and does not attenuate the signal of the channel CH_2. Filter 4B prevents AD converter 5 from having distortion produced due to the signal of the channel CH_1 having a comparatively high signal level. Filter 4B allows the signal of the channel CH_2 having a comparatively low signal level to have a C/N ratio in AD converter 5 not less than the required C/N ratio. As a result, even in a reception environment in which each channel has a large amplitude fluctuation due to fading, receiver 1 (1B to 1F) can have high receiving quality, thereby receiving the signals of the channels simultaneously.

Receiver 1 (1B to 1F) heterodynes the received signal in an RF band to an IF band with using oscillator 2 and frequency converter 3. Alternatively, the RF signal can be supplied directly to filter 4. In this cases that filter 4 preferably has a sharp cut-off frequency and that AD converter 5 operates at a sampling frequency twice higher than the frequency of the received signal. This arrangement can eliminate oscillator 2 and frequency converter 3 to reduce the size of receiver 1 (1B-1F).

In receiver 1 (1B to 1F), an RF band signal may be heterodyned to a baseband signal so as to perform direct conversion reception with using oscillator 2 and frequency converter 3. This arrangement can eliminate a filter for remove image signals, providing receiver 1 (1B-1F) with a small size.

Figure 12C:
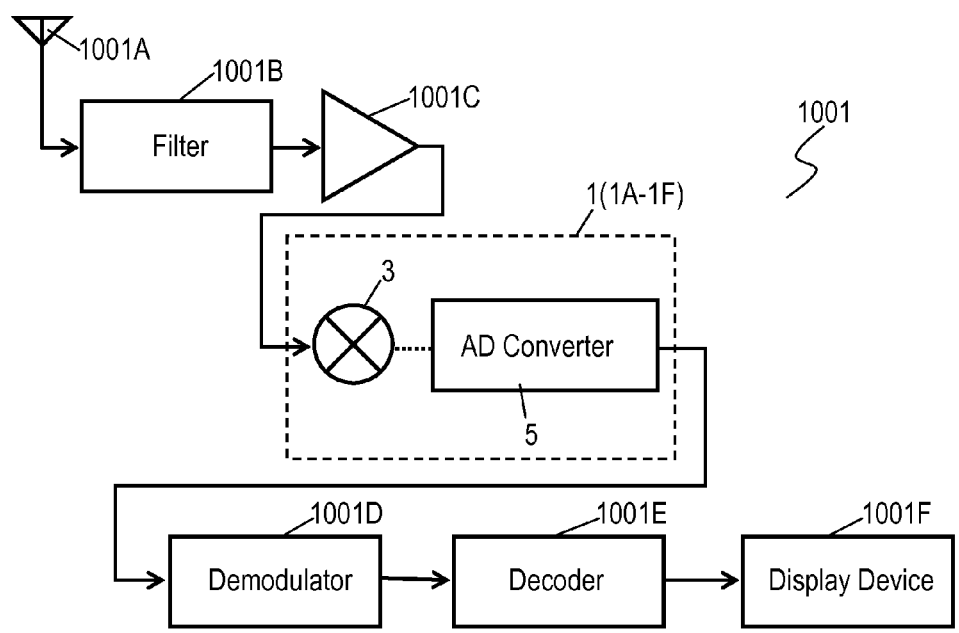
FIG. 12C is a block diagram of an electronic device including the receiver according to Embodiment 1.

FIG. 12C is a block diagram of electronic device 1001 including receiver 1 (1B-1F) according to Embodiment 1. Electronic device 1001 includes receiver 1 (1B-1F), antenna 1001A, filter 1001B, amplifier 1001C, demodulator 1001D, decoder 1001E, and display device 1001F. Antenna 1001A receives signals. Filter 1001B is connected to antenna 1001A. Amplifier 1001C is connected to an output of filter 1001B. Decoder 1001E is connected to an output of demodulator 1001D. Display device 1001F is connected to an output of decoder 1001E. An output of amplifier 1001C is connected to frequency converter 3 shown in FIG. 1. An output of AD converter 5 is connected to demodulator 1001D.

Exemplary Embodiment 2

Figure 13:
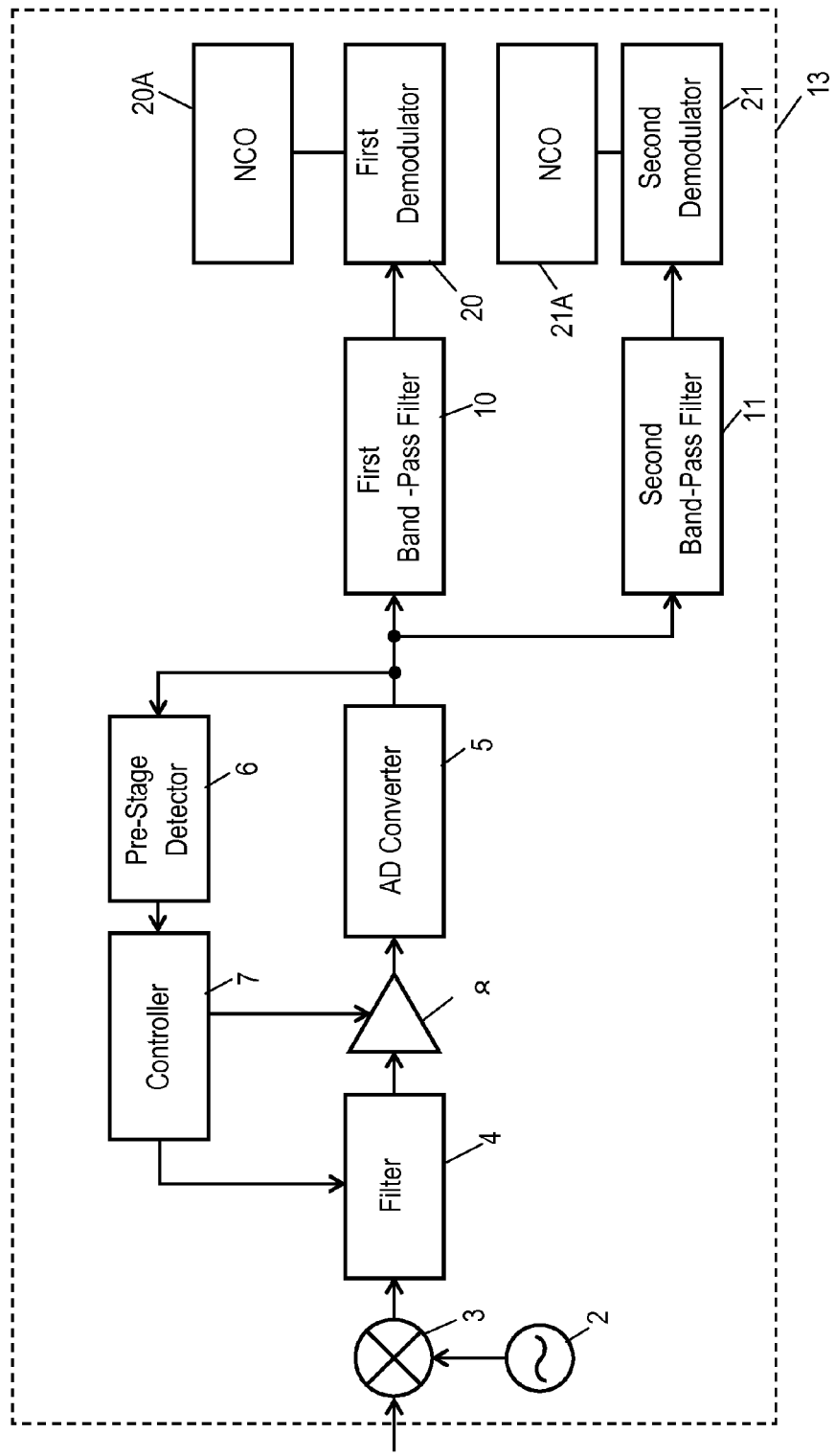
FIG. 13 is a block diagram of a receiver according to Exemplary Embodiment 2 of the invention.

FIG. 13 is a block diagram of receiver 13 according to Exemplary Embodiment 2 of the present invention. Receiver 13 receives, e.g. terrestrial digital TV broadcasting and includes oscillator 2, frequency converter 3, filter 4 connected to an output of frequency converter 3, AD converter 5 connected to an output of filter 4, pre-stage detector 6 connected to an output of AD converter 5, and controller 7. Oscillator 2 generates a local oscillator signal. Frequency converter 3 heterodynes the received signals of one or more frequency bands into intermediate frequency (IF) signals with using the local oscillator signal generated by oscillator 2. Filter 4 has a cut-off frequency which can be changed. AD converter 5 converts analog signals of one or more frequency bands into digital signals. Pre-stage detector 6 detects the signal level of the digital signals. Controller 7 controls the cut-off frequency of filter 4 based on the signal level detected by pre-stage detector 6. Receiver 13 further includes first band-pass filter 10 and second band-pass filter 11 which are connected to the output of AD converter 5. Filter 10 passes only a signal of a first frequency band, whereas filter 11 passes only a signal of a second frequency band. Receiver 1 further includes first demodulator 20 and second demodulator 21. Demodulator 20 demodulates the signal of the first frequency band which passes through first band-pass filter 10. Demodulator 21 demodulates the signal of second frequency band which passes through second band-pass filter 11.

Receiver 13 further includes numerically-controlled oscillator (NCO) 20A connected to first demodulator 20 and NCO 21A connected to second demodulator and 21. NCOs 20A and 21A convert the signals passing through first and second band-pass filters 10 and 11 into baseband signals, respectively.

Receiver 13 including plural demodulators 20 and 21 can demodulate plural receiving channels simultaneously, thereby reducing a time for channel selection. Thus, receiver 13 according to this embodiment can concurrently receive plural channels by including the same number of demodulators as the number of desired channels. This arrangement does not necessitate the same number of oscillators 2, frequency converters 3, filters 4, variable gain amplifiers 8, and AD converters 5 as the number of the desired channels, hence allowing receiver 13 to have a small size. Thus, the receiver receiving plural channels simultaneously can be compact by having one system of circuits prior to AD converter 5, which is a large-scale analog circuit. It does not increase the circuit size to provide plural band-pass filters 10 and 11 and demodulators 20 and 21 since they are small-scale digital circuits.

Figure 14:
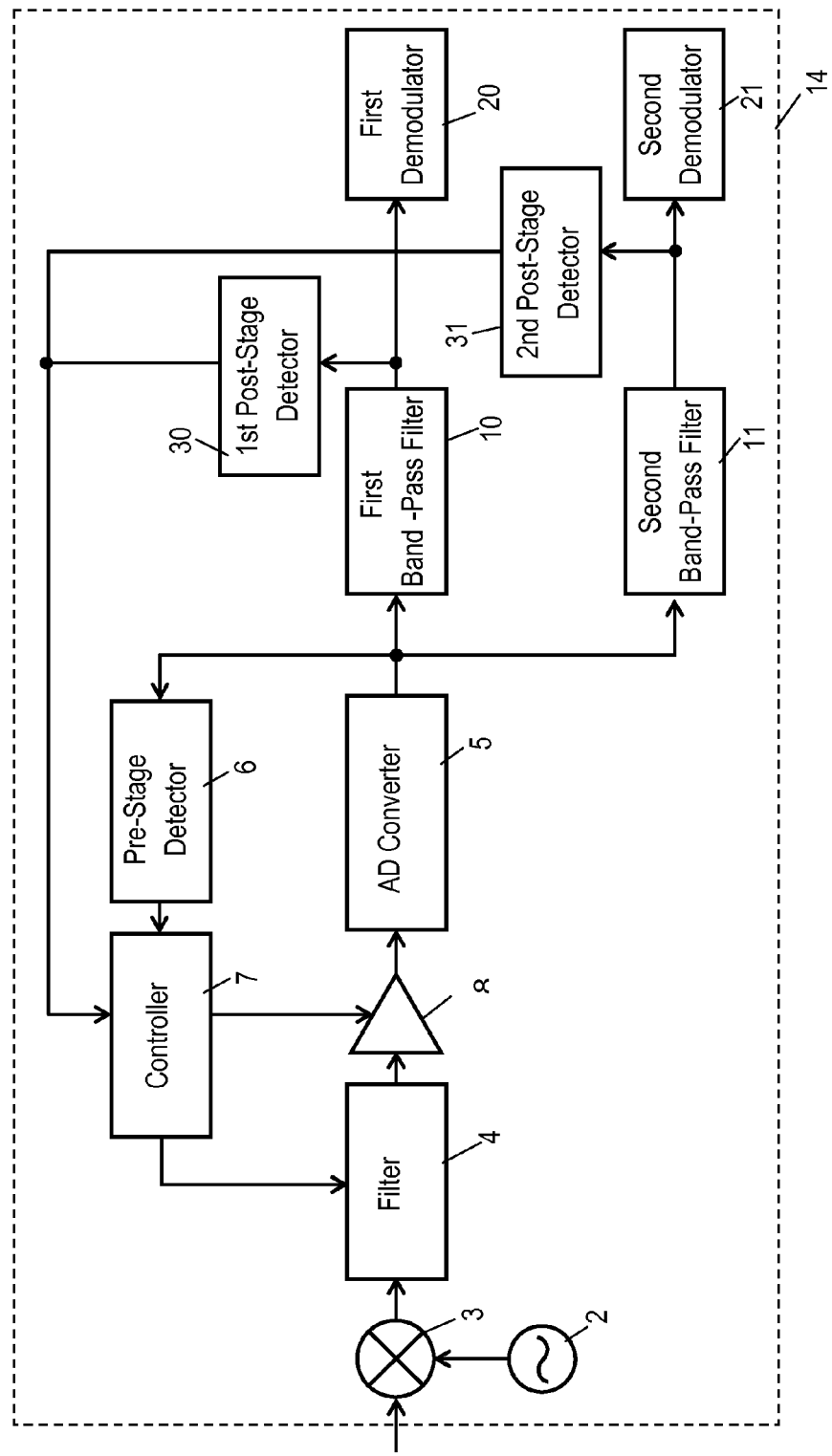
FIG. 14 is a block diagram of another receiver according to Embodiment 2.

FIG. 14 is a block diagram of another receiver 14 according to Embodiment 2. In FIG. 14, components identical to those of receiver 13 shown in FIG. 13 are denoted by the same reference numerals, and their description will be omitted. Receiver 14 shown in FIG. 14 includes first and second post-stage detectors 30 and 31. First post-stage detector 30 is connected between first band-pass filter 10 and first demodulator 20 so as to detect the signal level of the signal of the first frequency band. Second post-stage detector 31 is connected between second band-pass filter 11 and second demodulator 21 so as to detect the signal level of the signal of the second frequency band. The outputs of first and second post-stage detectors 30 and 31 are connected to controller 7. Controller 7 compares the levels detected by pre-stage detector 6 and first and second post-stage detector 30 and 31 to predetermined values, and controls filter 4 and variable gain amplifier 8 according to the comparison results.

An operation of receiver 14 according to Embodiment 2 in a specific receiving environment will be described with reference to FIG. 14. In the following description, a received signal is a terrestrial digital TV broadcasting channel, and a frequency allocation of a received channel is known. For easier explanation, the receiver has two systems each including a band-pass filter, a post-stage detector, and a demodulator, as shown in FIG. 14 so as to receive two channels simultaneously. Receiver 14 according to the present invention can receive three or more channels simultaneously by including three or more systems each including the band-pass filter, the post-stage detector, and the demodulator connected in parallel after AD converter 5.

As shown in FIG. 5, receiver 14 cannot simultaneously receive two channels separated from each other by a width more than the limit of the extension of the band due to the change of the cut-off frequency fc of filter 4, that is, than the limit of extension of the pass-band width Wp. In this case, controller 7 does not preferably change the cut-off frequency fc of filter 4, that is, does not extend the pass-band width Wp. For example, in the case that a frequency band is allocated to each broadcasting station in each region of a country, such as terrestrial digital TV broadcasting or conventional analog TV broadcasting in Japan, controller 7 of receiver 14 stores, for example, a channel table. Controller 7 refers to the stored channel table, and determines whether or not the space between the frequencies of two desired channels exceeds the extension limit of the cut-off frequency fc of filter 4. When the space exceeds the extension limit, controller 7 does not change the cut-off frequency fc of filter 4, that is, does not extend the pass-band width Wp. On the other hand, when the space between the frequencies of two channels is within the extension limit of the cut-off frequency fc, controller 7 changes the cut-off frequency fc, that is, extend the pass-band width Wp. In the former case, filter 4 only passes a signal corresponding to one channel, and therefore, in order to reduce electric power consumption, controller 7 preferably turns off at least one of second band-pass filter 11, second post-stage detector 31, and second demodulator 21.

Receiver 14 receives signals within the extension limit of the cut-off frequency fc of filter 4, that is, the pass-band width Wp as shown in FIG. 4. In this case, first post-stage detector 30 detects the signal level of only a signal of the passing frequency band of first band-pass filter 10, and second post-stage detector 31 detects the signal level of only a signal of the passing frequency band of second band-pass filter 11. Thus, post-stage detectors 30 and 31 can accurately detect the signal levels of the receiving channels, and controller 7 can control the cut-off frequency fc of filter 4 according to the signal level of each received signal, hence providing receiver 14 with high receiving quality.

Alternatively, controller 7 may control the cut-off frequency of filter 4 based on signals indicating receiving quality output from first and second demodulators 20 and 21. This control of controller 7 will be described below.

When the difference between levels of the two signals of the channels CH_1 and CH_2 is within the reference range as shown in FIG. 4, controller 7 changes the cut-off frequency fc from the frequency f1 to the frequency f2, thereby extending the pass-band width Wp from the width Wp1 to the width Wp2. In the case that the signals of the two channels CH_1 and CH_2 are AD-converted when the required C/N ratio of the channel CH_1 is too high, the quantization error in AD converter 5 is increased, thereby reducing the C/N ratio of the signal of channel CH_1 to be smaller than the required C/N ratio. This prevents the signal of the channel CH_1 from being demodulated accurately. In this case, controller 7 changes the cut-off frequency fc of filter 4 according not only to the signal levels of the first and second frequency bands detected by first and second post-stage detectors 30 and 31, respectively, but also to the receiving quality, such as their C/N ratios, of the output signals of first and second demodulators 20 and 21. Thus, receiver 14 can try to receive two desired channels simultaneously, and then can determine that the channels can not be received when the receiving environment is not good. Controller 7 can adaptively switch control by returning the cut-off frequency fc of filter 4 from the frequency f2 to the frequency f1 depending on whether the environment allows the simultaneous receiving of the two channels or causes trouble. Then, controller 7 can provide AD converter 5 with a signal close to its dynamic range $D_{AD}$. As a result, receiver 14 has high receiving quality.

Figure 15:
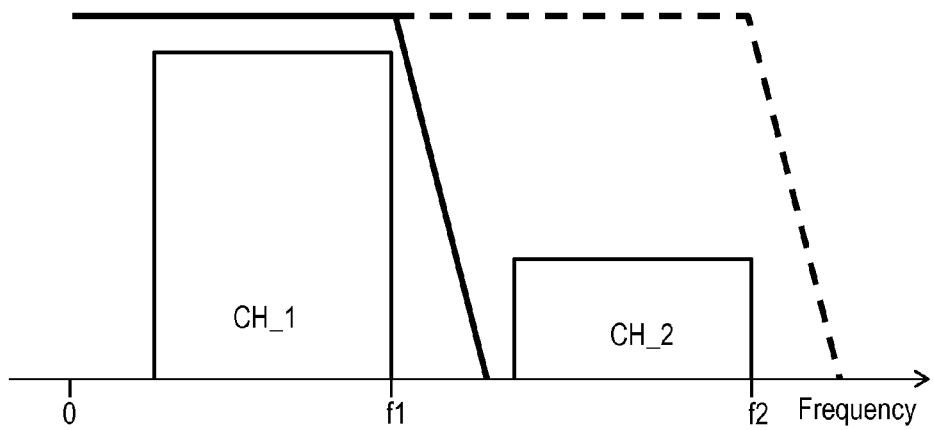
FIG. 15 shows passing characteristics of a filter and a frequency allocation of received signals of the receiver according to Embodiment 2.

In order to demodulate a desired signal of terrestrial digital TV broadcasting, it takes about 5 ms to lock up oscillator 2, which is required to adjust the oscillation frequency to the selected channel. In addition, it takes 500 to 600 ms to perform a frame synchronization of the signal supplied to first demodulator 20. These time periods causes to make channel selection for a certain period of time. FIG. 15 shows a pass characteristic of filter 4 and a frequency allocation of signals received by receiver 14. An operation of controller 7 to reduce the time for channel selection in a reception environment will be described below. In the reception environment, the level of the signal of the channel CH_1 is larger than the level of the channel CH_2, as shown in FIG. 15, and the difference between the levels of two signals is out of the reference range.

In this reception environment, when having a C/N ratio smaller than the required C/N ratio, the signal of the channel CH_2 needs to be amplified to a predetermined level. When the cut-off frequency fc of filter 4 is the frequency f2, the signal of the channel CH_1 passes through filter 4 simultaneously with the signal of the channel CH_2. Therefore, when amplifying these two signals, variable gain amplifier 8 is saturated due to the amplification of the signal of the channel CH_1 having a large signal level. In this case, receiver 14 may return the cut-off frequency fc of filter 4 to the frequency f1 without receiving the signal of the channel CH_2 simultaneously to the signal of the channel CH_1. Alternatively, two signals can be received while keeping the cut-off frequency fc of filter 4 at the frequency f2. More specifically, when the cut-off frequency fc is the frequency f2, the signal of the channel CH_2 cannot be correctly demodulated since its level is so small, making its C/N ratio smaller than the required C/N ratio. However, second demodulator 21 may establishes synchronization of the channel CH_2.

Figure 16A:
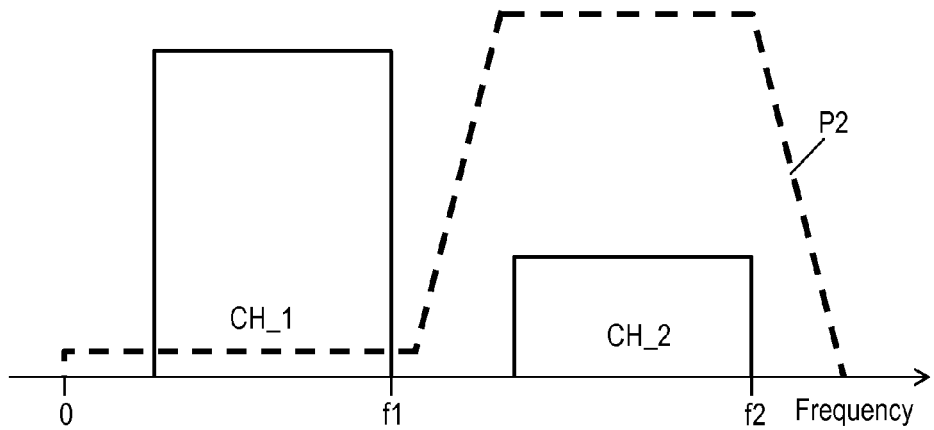
FIG. 16A shows passing characteristics of a filter and a frequency allocation of the received signals of the receiver according to Embodiment 2.

FIG. 16A shows pass characteristic P2 of filter 4 and a frequency allocation of received signals of receivers 13 and 14. Filter 4 is a band-pass filter having a pass-band width of at least one channel. In the case that a user watching the channel CH_1 changes the channel to the channel CH_2, upon receiving a channel selection command from the user to change to the channel CH_2, controller 7 changes the passband of the filter 4 from the pass-band width of both the channels CH_1 and CH_2 to the pass-band width of only the channel CH_2, as shown in FIG. 16A, without changing the oscillation frequency of oscillator 2. Controller 7 then controls variable gain amplifier 8 such that the signal of the channel CH_2 passing through filter 4 can have an appropriate input level for AD converter 5. Thus, controller 7 allows the user to watch the channel CH_2 without changing the oscillation frequency of oscillator 2. This operation can eliminate the above-described lock-up time of oscillator 2 which is required to receive only the signal of the channel CH_2 or the frame synchronization time in demodulator 20. As a result, the channel selection can be performed more smoothly than the case of changing the oscillation frequency of oscillator 2 from the channel CH_1 to the channel CH_2. This operation can reduce the time for channel selection, and hence, reduce the user's stress caused by the time for channel selection. Filter 4 is not necessarily a band-pass filter, and may include one or more band-pass filters 40 and one or more attenuators 50, as shown in FIG. 12, so that filter 4 can be controlled by controller 7 so as to have pass characteristic P1 shown in FIG. 11.

In receiver 14 shown in FIG. 14, first post-stage detector 30 may detect a signal from any portion of first demodulator 20. Similarly, second post-stage detector 31 may detect a signal from any portion part of second demodulator 21. Post-stage detectors 30 and 31 may detect not only signal levels but also quality values, such as the C/N ratio or the bit error rate (BER) after Viterbi decoding, indicating signal quality. These quality values are compared to comparison values by controller 7. Controller 7 may adaptively switch between signals or methods for detecting signal quality so as to improve reliability according to the reception environment. For example, the user or a circuit designer can set switching between the following two operations according to the reception environment of receivers 13 and 14 so as to improve the receiving quality and to reduce power consumption. One of the two operations is that first and second post-stage detectors 30 and 31 detect the C/N ratio of a received signal from first and second demodulators 20 and 21, and controller 7 suspends receiving the signal having a C/N ratio smaller than the required C/N ratio. The other of the two operations is that first and second post-stage detectors 30 and 31 detect the BER after Viterbi decoding from first and second demodulators 20 and 21, and controller 7 suspends receiving the signal having a BER smaller than a predetermined value.

In the above-described operation, the received signal is not limited to a terrestrial digital TV broadcasting signal. When the frequency allocation of the received channel is not known, receivers 13 and 14 perform a high-speed channel search. It takes 5 ms to lock up the frequency of the local oscillator signal, and it takes 500 ms to take frame synchronization of demodulators 20 and 21. Therefore, a conventional channel search searching all of 1 to 62 TV channels in Japan takes at least 31 seconds ($\approx 62 \times (5+500)$). The time to wait for signal frame synchronization can be reduced since receivers 13 and 14 detect the levels (electric power) of the received signals, which are increased by controlling the cut-off frequency of filter 4. In terrestrial digital TV broadcasting in Japan, signals are transmitted in an orthogonal frequency division multiplexing (OFDM) system, and the effective symbol length is about 1 ms. In the case that the time for measuring the level (electric power) of a received signal is 1 ms corresponding to the effective symbol length. In this case, the search time for one channel is only 6 ms including the lock-up time 5 ms of the oscillation frequency, and therefore, the search time for all channels is only 0.4 s ($\approx 6 \times 62$). In actual, not all channels have TV signals. Therefore, extending the pass-band width by changing the cut-off frequency fc of filter 4 in receivers 13 and 14 can eliminate to adjust the oscillation frequency to frequencies not having any channel. As a result, the channel search is further speeded up. In this case, controller 7 of receivers 13 and 14 does not necessarily search a frequency allocation of the channels that have been searched in each area stored in controller 7. This can omit to perform an all channel search in the areas which have gone through a channel search before, thereby reducing the channel search time.

The cut-off frequency of filter 4 can be changed by other methods than changing it from channel to channel. More specifically, instead of being extended in the unit of channel frequency band, the cut-off frequency fc of filter 4 can be extended gradually using an element capable of continuously changing the frequency, such as a variable capacitance capacitor. As a result, the pass-band width is extended gradually so as to detect the level of the signal. This operation prevents variable gain amplifier 8 from saturating by suddenly receiving high power as the result of the extension of the cut-off frequency fc of filter 4.

Each of receivers 13 and 14 includes two systems each including the band-pass filter connected to the output of AD converter 5, and the demodulator for demodulating the signal passed through the band-pass filter. Alternatively, each of receivers 13 and 14 may have one, three, or more systems according to the number of channels required by the user or the designer, the cost, or the receiver size. Alternatively, it is possible to switch between the outputs of plural band-pass filters connected to the output of AD converter 5 so as to perform demodulation by one demodulator. It is also possible that receiver 14 includes one or more post-stage detectors.

In receivers 13 and 14, variable gain amplifier 8 is connected between filter 4 and AD converter 5, but may alternatively be absent, or be connected between frequency converter 3 and filter 4 because of the above-described reason. Furthermore, pre-stage detector 6 connected to the output of AD converter 5 may alternatively be connected between filter 4 and AD converter 5 because of the above-described reason.

In the above-mentioned TFS, which is foreseen as European digital TV broadcasting standard, attempts have been made to use plural tuners since the frequencies are switched to watch one program. The present invention allows different channels having different frequencies to be received simultaneously, thereby eliminating plural tuners, to provide the receiver with a small size.

Figure 16B:
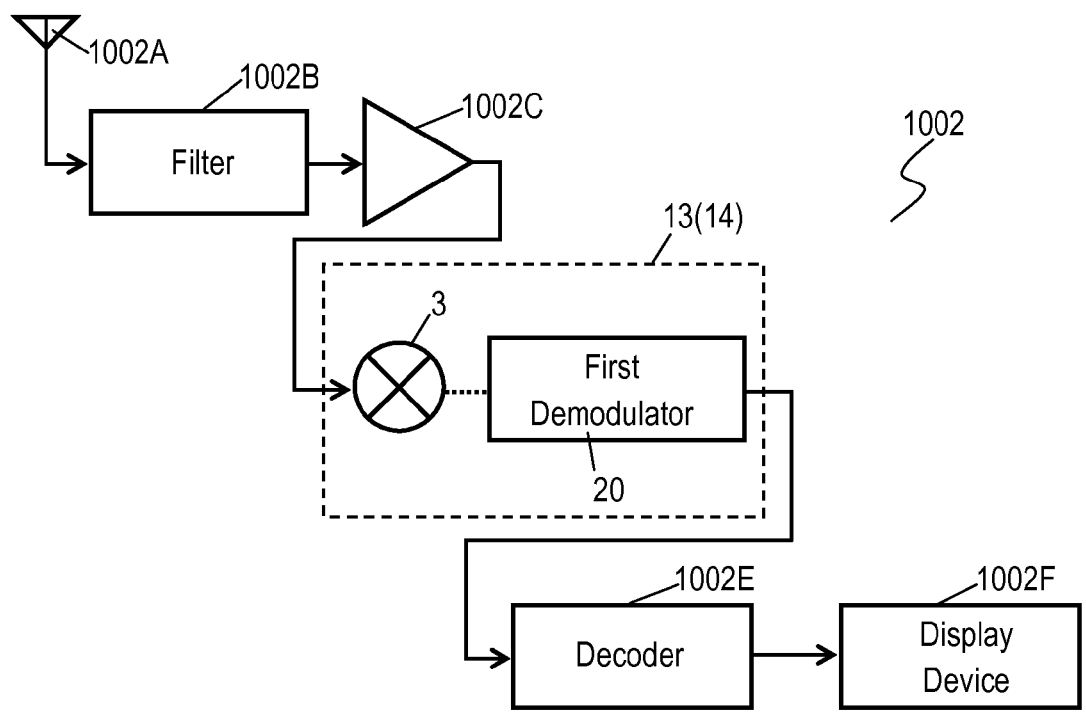
FIG. 16B is a block diagram of an electronic device including the receiver according to Embodiment 2.
Figure 17:
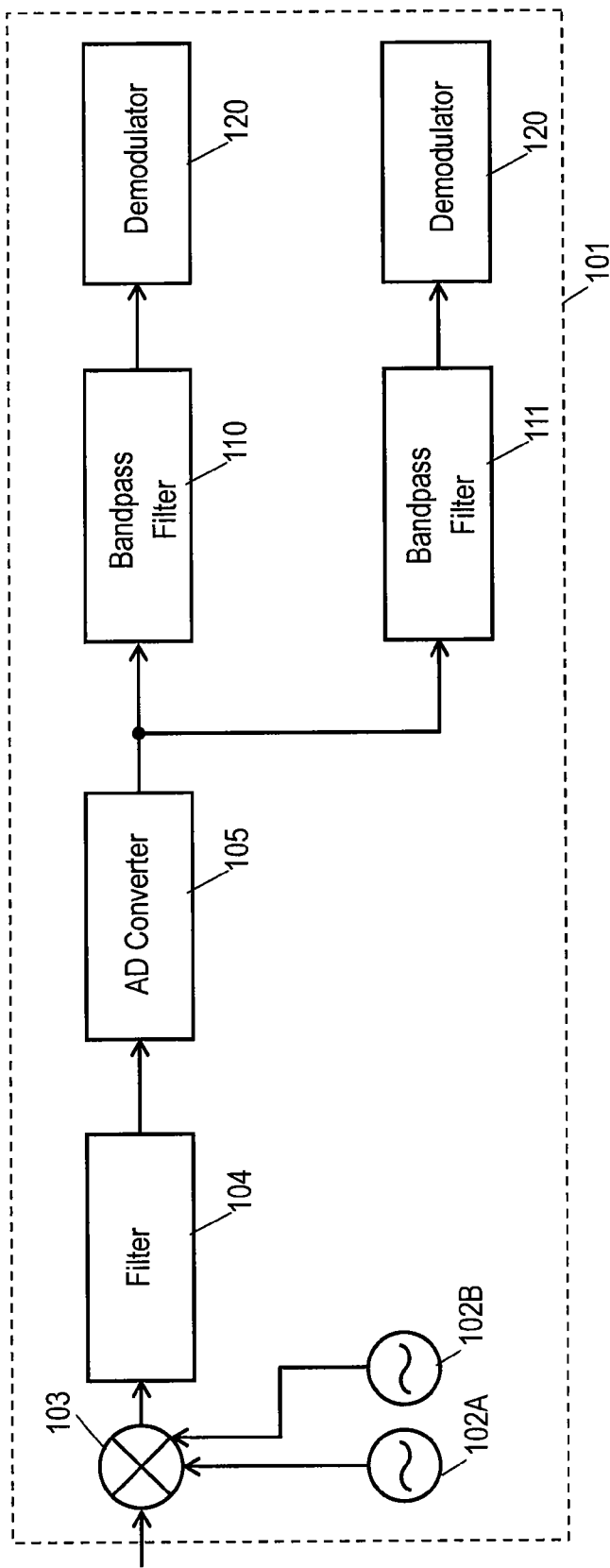
FIG. 17 is a block diagram of a conventional receiver.

FIG. 16B is a block diagram of electronic device 1002 including receiver 13 (14) according to Embodiment 2. Electronic device 1002 includes receiver 13 (14), antenna 1002A for receiving signals, filter 1002B connected to antenna 1002A, amplifier 1002C connected to the output of filter 1002B, decoder 1002E, and display device 1002F connected to decoder 1002E. The output of amplifier 1002C is connected to frequency converter 3 shown in FIGS. 13 and 14. The output of first demodulator 20 is connected to the input terminal of decoder 1001E.

INDUSTRIAL APPLICABILITY

A receiver according to the present invention has high receiving performance, and is applicable to electronic devices, such as digital TV broadcasting receivers.

The invention claimed is:

1. A receiver for receiving a signal of a plurality of frequency bands simultaneously, the plurality of frequency bands including a frequency band of a desired channel and a frequency band of an adjacent channel adjacent to the desired channel, said receiver comprising:
an oscillator for generating a local oscillator signal;
a frequency converter for heterodyning the signal of the plurality of frequency bands into an intermediate frequency (IF) signals using the local oscillator signal;
a filter connected to an output of the frequency converter, the filter having a variable cut-off frequency;
an analog-digital (AD) converter connected to an output of the filter, the AD converter converting the signal of the plurality of frequency bands into a digital signal, the AD converter having a dynamic range;
a pre-stage detector connected to an output of the AD converter or connected between the filter and the AD converter, the pre-stage detector detecting a signal level; and
a controller for controlling the variable cut-off frequency of the filter based at least on the dynamic range and the signal level detected by the pre-stage detector to cause the variable cut-off frequency to be selectively at least a first cut-off frequency and a second cut off frequency, the first cut-off frequency defining a pass band passing the frequency band of the desired channel, the second cut-off frequency defining a pass band passing the frequency band of the adjacent channel,
wherein the controller is operable to:
maintain the variable cut-off frequency at least at the second cut-off frequency when the signal level detected by the pre-stage detector is lower than the dynamic range; and
vary the variable cut-off frequency to the first cut-off frequency when the signal level detected by the pre-stage detector is higher than the dynamic range.

2. The receiver according to claim 1, wherein the pre-stage detector is connected to the output of the AD converter.

3. The receiver according to claim 1, wherein the pre-stage detector is connected between the filter and the AD converter.

4. The receiver according to claim 1, wherein the controller does not extend the variable cut-off frequency of the filter when the receiver concurrently receives signals of a plurality of frequency bands separated from each other by an interval more than a limit of extension of the variable cut-off frequency of the filter.

5. The receiver according to claim 1, further comprising a variable gain amplifier connected between the filter and the AD converter, the variable gain amplifier amplifying a received signal, wherein
the controller controls a gain of the variable gain amplifier based on the signal level detected by the pre-stage detector.

6. The receiver according to claim 1, further comprising a variable gain amplifier connected to an input of the filter, the variable gain amplifier amplifying a received signal, wherein
the controller controls a gain of the variable gain amplifier based on the signal level detected by the pre-stage detector.

7. A receiver for receiving a signal of a plurality of frequency bands simultaneously, the plurality of frequency bands including a frequency band of a desired channel and a frequency band of an adjacent channel adjacent to the desired channel, said receiver comprising:
an oscillator for generating a local oscillator signal;
a frequency converter for heterodyning the signal of the plurality of frequency bands into an intermediate frequency (IF) signal with using the local oscillator signal;
a variable filter connected to an output of the frequency converter, the variable filter having a variable cut-off frequency;
an analog-digital (AD) converter connected to an output of the variable filter, the AD converter converting the signal of the plurality of frequency bands into a digital signal the AD converter having a dynamic range;
a pre-stage detector connected to an output of the AD converter of connected between the variable filter and the AD converter, the pre-stage detector detecting a signal level;
a controller for controlling the variable cut-off frequency of the variable filter based at least on the dynamic range and the signal level detected by the pre-stage detector to cause the variable cut-off frequency to be selectively at least a first cut-off frequency and a second cut-off frequency, the first cut-off frequency defining a pass band passing the frequency band of the desired channel, the second cut-off frequency defining a pass band passing the frequency band of the adjacent channel;
a first band-pass filter connected to the output of the AD converter;
a first demodulator connected to an output of the variable first band-pass filter;
a second band-pass filter connected to the output of the AD converter, the second band-pass filter having a different passing frequency band from the first band-pass filter; and
a second demodulator connected to an output of the second band-pass filter,
wherein the controller is operable to:
maintain the variable cut-off frequency at least at the second cut-off frequency when the signal level detected by the pre-stage detector is lower than the dynamic range; and
vary the variable cut-off frequency to the first cut-off frequency when the signal level detected by the pre-stage detector is higher than the dynamic range.

8. The receiver according to claim 7, further comprising:
a first post-stage detector connected to the output of the first band-pass filter, the first post-stage detector detecting a signal level; and a second post-stage detector connected to the output of the second band-pass filter, the second post-stage detector detecting a signal level, wherein the controller controls the variable cut-off frequency of the variable filter based on the signal level detected by the first post-stage detector and the signal level detected by the second post-stage detector.

9. The receiver according to claim 7, wherein the controller controls the variable cut-off frequency of the variable filter based on a signal indicating a receiving quality of a signal output from the first demodulator and on a signal indicating a receiving quality of a signal output from the second demodulator.

10. The receiver according to claim 7, further comprising
a variable gain amplifier connected between the variable filter and the AD converter, the variable gain amplifier amplifying a received signal, wherein
the controller controls a gain of the variable gain amplifier based on the signal level detected by the pre-stage detector.

11. The receiver according to claim 7, further comprising
a variable gain amplifier connected to an input of the variable filter, the variable gain amplifier amplifying a received signal, wherein
the controller controls a gain of the variable gain amplifier based on the signal level detected by the pre-stage detector.

12. An electronic device comprising:
the receiver according to claim 1;
a signal processor connected to an output of the receiver; and
a display device connected to an output of the signal processor.

13. An electronic device comprising:
the receiver according to claim 7;
a signal processor connected to an output of the receiver; and
a display device connected to an output of the signal processor.

14. The receiver according to claim 1, wherein the controller is operable to:
maintain the variable cut-off frequency at the second cut-off frequency while a difference between a first level and a second level is within a reference range, the first signal level being a signal level detected by the pre-stage detector while the variable cut-off frequency is the first cut-off frequency, the second signal level being a signal level detected by the pre-stage detector while the variable cut-off frequency is the second cut-off frequency, and
vary the variable cut-off frequency to the first cut-off frequency while the difference between the first level and the second level is larger than the reference range even when the first signal level is lower than the dynamic range.

15. The receiver according to claim 7, wherein the controller is operable to:
maintain the variable cut-off frequency at the second cut-off frequency while a difference between a first level and a second level is within a reference range, the first signal level being a signal level detected by the pre-stage detector while the variable cut-off frequency is the first cut-off frequency, the second signal level being a signal level detected by the pre-stage detector while the variable cut-off frequency is the second cut-off frequency, and
vary the variable cut-off frequency to the first cut-off frequency while the difference between the first level and the second level is larger than the reference range even when the first signal level is lower than the dynamic range.

16. A receiver for receiving a plurality of signals of a plurality of frequency bands simultaneously, said receiver comprising:
an oscillator for generating a local oscillator signal;
a frequency converter for heterodyning the plurality of signals into intermediate frequency (IF) signals using the local oscillator signal;
a variable filter connected to an output of the frequency converter, the variable filter having a cut-off frequency changeable;
an analog-digital (AD) converter connected to an output of the variable filter, the AD converter converting an analog signal of a plurality of frequency bands into digital signals;
a pre-stage detector connected to an output of the AD converter of connected between the variable filter and the AD converter, the pre-stage detector detecting a signal level;
a controller for controlling the cut-off frequency of the variable filter based on the signal level detected by the pre-stage detector;
a first band-pass filter connected to the output of the AD converter;
a first demodulator connected to an output of the first band-pass filter;
a second band-pass filter connected to the output of the AD converter, the second band-pass filter having a different passing frequency band from the first band-pass filter;
a second demodulator connected to an output of the second band-pass filter;
a first post-stage detector connected to the output of the first band-pass filter, the first post-stage detector detecting a signal level; and
a second post-stage detector connected to the output of the second band-pass filter, the second post-stage detector detecting a signal level, wherein
the controller controls the cut-off frequency of the variable filter based on the signal level detected by the first post-stage detector and the signal level detected by the second post-stage detector.

17. A receiver for receiving a plurality of signals of a plurality of frequency bands simultaneously, said receiver comprising:
an oscillator for generating a local oscillator signal;
a frequency converter for heterodyning the plurality of signals into intermediate frequency (IF) signals using the local oscillator signal;
a variable filter connected to an output of the frequency converter, the variable filter having a cut-off frequency changeable;
an analog-digital (AD) converter connected to an output of the variable filter, the AD converter converting an analog signal of a plurality of frequency bands into digital signals;
a pre-stage detector connected to an output of the AD converter of connected between the variable filter and the AD converter, the pre-stage detector detecting a signal level;
a controller for controlling the cut-off frequency of the variable filter based on the signal level detected by the pre-stage detector;
a first band-pass filter connected to the output of the AD converter;

a first demodulator connected to an output of the first band-pass filter;

a second band-pass filter connected to the output of the AD converter, the second band-pass filter having a different passing frequency band from the first band-pass filter; and a second demodulator connected to an output of the second band-pass filter;

wherein the controller controls the cut-off frequency of the variable filter based on a signal indicating a receiving quality of a signal output from the first demodulator and on a signal indicating a receiving quality of a signal output from the second demodulator.

* * * * *